(12) United States Patent
Nakashiba

(10) Patent No.: US 10,115,783 B2
(45) Date of Patent: Oct. 30, 2018

(54) SEMICONDUCTOR DEVICE, METHOD OF MANUFACTURING THE SAME, AND SIGNAL TRANSMITTING/RECEIVING METHOD USING THE SEMICONDUCTOR DEVICE

(71) Applicant: RENESAS ELECTRONICS CORPORATION, Tokyo (JP)

(72) Inventor: Yasutaka Nakashiba, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 156 days.

(21) Appl. No.: 15/598,475

(22) Filed: May 18, 2017

(65) Prior Publication Data

US 2017/0256602 A1    Sep. 7, 2017

Related U.S. Application Data

(63) Continuation of application No. 14/255,270, filed on Apr. 17, 2014, now Pat. No. 9,685,496, which is a
(Continued)

(30) Foreign Application Priority Data

Dec. 4, 2007   (JP) ................. 2007-313821

(51) Int. Cl.
*H01L 31/02*    (2006.01)
*H01L 27/08*    (2006.01)
(Continued)

(52) U.S. Cl.
CPC .......... *H01L 28/10* (2013.01); *G01R 31/2886* (2013.01); *G01R 31/303* (2013.01); *G01R 31/3025* (2013.01)

(58) Field of Classification Search
CPC ..... H01L 28/10; H01L 23/48; H01L 23/5389; H01L 24/09; H01L 24/89; H01L 25/16;
(Continued)

(56) References Cited

U.S. PATENT DOCUMENTS 5,773,880 A   6/1998 Ohno
6,378,774 B1  4/2002 Emori et al.
(Continued)

FOREIGN PATENT DOCUMENTS

JP    6-48078 A    2/1994
JP    2002-025888 A    1/2002
(Continued)

OTHER PUBLICATIONS

Office Action in U.S. Appl. No. 14/255,270 dated May 4, 2015.
(Continued)

*Primary Examiner* — Duy T Nguyen
(74) *Attorney, Agent, or Firm* — McGinn LP Law Group, PLLC.

(57) ABSTRACT

A semiconductor device includes a semiconductor substrate including a semiconductor chip formation region, a chip internal circuit provided within the semiconductor chip formation region of the semiconductor substrate, a signal transmitting/receiving unit which is provided within the semiconductor chip formation region of the semiconductor substrate, transmits/receives a signal to/from an outside in a non-contact manner by one of electromagnetic induction and capacitive coupling, and transmits/receives a signal to/from the chip internal circuit through electrical connection to the chip internal circuit, and a power receiving inductor which has a diameter provided along an outer edge of the semiconductor chip formation region of the semiconductor substrate so as to surround the chip internal circuit and the signal transmitting/receiving unit, receives a power supply
(Continued)

signal from the outside in the non-contact manner, and is electrically connected to the chip internal circuit.

2 Claims, 3 Drawing Sheets

Related U.S. Application Data continuation of application No. 13/137,074, filed on Jul. 19, 2011, now Pat. No. 8,704,334, which is a continuation of application No. 12/292,820, filed on Nov. 26, 2008, now Pat. No. 8,004,054.

(51) Int. Cl.
  *H01L 49/02* (2006.01)
  *G01R 31/28* (2006.01)
  *G01R 31/303* (2006.01)
  *G01R 31/302* (2006.01)

(58) Field of Classification Search
  CPC .............. G01R 31/2886; G01R 31/303; G01R 31/3025
  USPC ............ 257/728, 730, E23.18, E23.182, 531
  See application file for complete search history.

(56) References Cited

U.S. PATENT DOCUMENTS

| | | | |
|---|---|---|---|
| 6,891,391 B2 | 5/2005 | Hiroki | |
| 7,152,804 B1* | 12/2006 | MacKenzie | G06K 19/07749 235/492 |
| 7,355,270 B2 | 4/2008 | Hasebe et al. | |
| 7,616,120 B1 | 11/2009 | Humes | |
| 2005/0051869 A1 | 3/2005 | Watanabe | |
| 2005/0173532 A1 | 8/2005 | Hasebe et al. | |
| 2005/0212690 A1 | 9/2005 | Nishikawa | |
| 2005/0258509 A1* | 11/2005 | Horikawa | H01L 23/49822 257/531 |
| 2006/0022287 A1 | 2/2006 | Itoi et al. | |
| 2006/0202831 A1 | 9/2006 | Horch | |
| 2007/0176845 A1 | 8/2007 | Yamazaki et al. | |
| 2007/0229279 A1 | 10/2007 | Yamazaki et al. | |
| 2007/0297214 A1 | 12/2007 | Dembo | |
| 2008/0030292 A1 | 2/2008 | Kubono et al. | |
| 2008/0083969 A1 | 4/2008 | Osada | |
| 2008/0129623 A1 | 6/2008 | Barry | |
| 2008/0191332 A1 | 8/2008 | Koyama et al. | |
| 2008/0210762 A1 | 9/2008 | Osada | |
| 2008/0230873 A1 | 9/2008 | Demircan et al. | |
| 2009/0261173 A1 | 10/2009 | Yamazaki et al. | |
| 2011/0006794 A1* | 1/2011 | Sellathamby | G01R 31/3025 324/754.03 |

FOREIGN PATENT DOCUMENTS

| | | |
|---|---|---|
| JP | 2002-519849 A | 7/2002 |
| JP | 2002-340989 A | 11/2002 |
| JP | 2004-139207 A | 5/2004 |
| JP | 2004-281838 A | 10/2004 |
| JP | 2005-30877 A | 2/2005 |
| JP | 2005-228785 A | 8/2005 |
| JP | 2005-311331 A | 11/2005 |
| JP | 2007-134694 A | 5/2007 |
| WO | WO 96/42110 A1 | 12/1996 |
| WO | WO 99/67822 A1 | 12/1999 |

OTHER PUBLICATIONS

Office Action in U.S. Appl. No. 14/255,270 dated Jan. 15, 2016.
Office Action in U.S. Appl. No. 14/255,270 dated Sep. 15, 2016.
Notice of Allowance in U.S. Appl. No. 14/255,270 dated Feb. 13, 2017.
U.S. Office Action in co-pending related U.S. Appl. No. 13/137,074, dated Dec. 22, 2011.
Notice of Allowance in co-pending related U.S. Appl. No. 13/137,074, dated Jul. 30, 2012.
JP Notification of Reasons for Refusal dated Feb. 5, 2013 with English translation.
Chinese Office Action dated Dec. 14, 2010 (with English translation).
Japanese Office Action dated Jul. 22, 2014 with an English translation.
Japanese Office Action dated Jan. 27, 2015 with English Translation.
Japanese Office Action, dated May 10, 2016, and an English Translation.

* cited by examiner

SEMICONDUCTOR DEVICE, METHOD OF MANUFACTURING THE SAME, AND SIGNAL TRANSMITTING/RECEIVING METHOD USING THE SEMICONDUCTOR DEVICE

The present application is a Continuation Application of U.S. patent application Ser. No. 14/255,270, filed on Apr. 17, 2014, which is a Continuation Application of U.S. patent application Ser. No. 13/137,074, filed on Jul. 19, 2011, now U.S. Pat. No. 8,704,334, which is a Continuation Application of U.S. patent application Ser. No. 12/292,820, filed on Nov. 26, 2008, now U.S. Pat. No. 8,004,054, which is based on and claims priority from Japanese patent application No. 2007-313821, filed on Dec. 4, 2007, the entire contents of which are incorporated herein by reference.

BACKGROUND OF THE INVENTION

1. Field of the Invention

The present invention relates to a semiconductor device, a method of manufacturing the same, and a signal transmitting/receiving method using the semiconductor device.

2. Description of Related Art

These days, a semiconductor device which communicates data by radio communication is known.

JP 2007-134694 A describes a semiconductor device which communicates data by electromagnetic induction. The semiconductor device includes a coiled antenna and a semiconductor integrated circuit connected to the coiled antenna. When the coiled antenna connected to a reader/writer is brought close to the semiconductor device, an AC magnetic filed is generated from the coiled antenna connected to the reader/writer. The generated AC magnetic field passes through the coiled antenna contained in the semiconductor device, and an electromotive force is generated between terminals of the coiled antenna by electromagnetic induction, whereby the semiconductor integrated circuit contained in the semiconductor device is operated.

JP 2005-311331 A describes a structure in which an integrated circuit and an antenna are formed on the same substrate, and conductor wires or conductive films forming the antenna are formed in two layers so as to sandwich the substrate including the integrated circuit formed thereon. In JP 2005-311331 A, there is described an example in which the conductor wire formed in one layer serves as an antenna for supplying power to the integrated circuit, and the conductor wire formed in another layer serves as an antenna for transmitting/receiving a signal.

JP 2005-228785 A describes a structure in which a coiled antenna is disposed outside the profile of a circuit of a semiconductor chip. Further, JP 2005-30877 A describes a technology of mounting a built-in test circuit and a radio communication circuit in a semiconductor integrated circuit device, and controlling the built-in test circuit by a radio signal to run a test.

The present inventor has recognized as follows. Conventionally, in order to run a test on an internal circuit of a semiconductor device at a wafer level, for example, a pad of a chip surface of the semiconductor device is subjected to probing using a probe to supply the internal circuit with power, or a signal is transmitted/received for observation thereof. There arises a problem in that, for example, damage is caused to the pad by the probe during a probe test, which later leads to a poor connection in the case of bonding the pad, or in that the pad is scraped and small pieces are removed, which causes contamination. Moreover, along with a reduction in chip size and an increase in pads per one chip, a pad size and a pitch between the pads have been reduced, and hence it has become increasingly difficult to realize a sufficient electrical connection through application of a number of probes corresponding to a number of pads.

In order to avoid the above-mentioned problem, it is desired that power be supplied to the internal circuit or the signal be transmitted/received to/from the internal circuit in a non-contact manner. However, in order to transmit/receive various signals to/from the internal circuit by, for example, electromagnetic induction instead of a plurality of pads to correspond to input/output signals to the plurality of pads, a large number of inductors are necessary, which increases an area required to provide those inductors. As described in JP 2007-134694 A, JP 2005-311331 A, and JP 2005-228785 A, with the structure in which the coiled antenna for transmitting/receiving a signal is arranged on a perimeter of the chip, a number of antennas cannot be arranged. Alternatively, in the technology described in JP 2005-30877 A, it is assumed that only one antenna coil is arranged for one chip, and power is generated using a carrier wave of a radio signal to be input from the outside. On the other hand, for supplying the internal circuit with power, large electromagnetic force is required.

SUMMARY

The present invention provides a semiconductor device, including:
a semiconductor substrate including a semiconductor chip formation region;
a chip internal circuit provided within the semiconductor chip formation region of the semiconductor substrate;
a signal transmitting/receiving unit which is provided within the semiconductor chip formation region of the semiconductor substrate, transmits/receives a signal to/from an outside in a non-contact manner by one of electromagnetic induction and capacitive coupling, and transmits/receives a signal to/from the chip internal circuit through electrical connection to the chip internal circuit; and
a power receiving inductor which has a diameter provided along an outer edge of the semiconductor chip formation region of the semiconductor substrate so as to surround the chip internal circuit and the signal transmitting/receiving unit, receives a power supply signal from the outside in the non-contact manner, and is electrically connected to the chip internal circuit.

The present invention also provides a signal transmitting/receiving method, including:
bringing an external device close to a semiconductor device in a non-contact manner,
the semiconductor device including:
a semiconductor substrate including a semiconductor chip formation region;
a chip internal circuit provided within the semiconductor chip formation region of the semiconductor substrate;
a signal transmitting/receiving unit which is provided within the semiconductor chip formation region of the semiconductor substrate, and transmits/receives a signal to/from the chip internal circuit through electrical connection to the chip internal circuit; and
a power receiving inductor which has a diameter provided along an outer edge of the semiconductor chip formation region of the semiconductor substrate so as to surround the chip internal circuit and the signal transmitting/receiving unit, and is electrically connected to the chip internal circuit, the external device including:
  a power supply inductor corresponding to the power receiving inductor; and
  an external signal transmitting/receiving unit which transmits/receives a signal to/from the signal transmitting/receiving unit in the non-contact manner by one of electromagnetic induction and capacitive coupling; and transmitting/receiving the signal between the external signal transmitting/receiving unit and the signal transmitting/receiving unit, and transmitting/receiving a power supply signal between the power supply inductor and the power receiving inductor.

With the structure described above, the signal transmitting/receiving unit can be formed to be smaller than the power receiving inductor to be provided inside the power receiving inductor, with the result that an increase in chip size can be limited even when a plurality of the signal transmitting/receiving units are arranged. On the other hand, a diameter of the power receiving inductor can be increased, and hence a signal large enough to supply a power supply voltage can be obtained.

The present invention also provides a method of manufacturing a semiconductor device, including:

bringing an external device close to a semiconductor device in a non-contact manner, the semiconductor device including:
  a semiconductor substrate including a semiconductor chip formation region and a scribe line region provided around the semiconductor chip formation region;
  a chip internal circuit provided within the semiconductor chip formation region of the semiconductor substrate;
  a signal transmitting/receiving unit which is provided within the semiconductor chip formation region of the semiconductor substrate and transmits/receives a signal to/from the chip internal circuit through electrical connection to the chip internal circuit;
  a power receiving inductor which has a diameter provided along an outer edge of the semiconductor chip formation region of the semiconductor substrate so as to surround the chip internal circuit and the signal transmitting/receiving unit, and is electrically connected to the chip internal circuit;
  a bonding pad which is provided in the semiconductor chip formation region of the semiconductor substrate correspondingly to the signal transmitting/receiving unit and is electrically connected to the chip internal circuit; and
  a power supply bonding pad provided in the semiconductor chip formation region of the semiconductor substrate while being electrically connected to the chip internal circuit, the external device including:
  a power supply inductor corresponding to the power receiving inductor; and
  an external signal transmitting/receiving unit which transmits/receives a signal to/from the signal transmitting/receiving unit in the non-contact manner by one of electromagnetic induction and capacitive coupling;

transmitting/receiving the signal between the external signal transmitting/receiving unit and the signal transmitting/receiving unit;
transmitting/receiving a power supply signal between the power supply inductor and the power receiving inductor;
cutting the semiconductor device along the scribe line region into chips; and
connecting, in each of the chips of the semiconductor device, the bonding pad and the power supply bonding pad to the external signal transmitting/receiving unit and an external power supply circuit through a bonding wire, respectively.

With the structure described above, before the semiconductor substrate is cut into chips, the signal as transmitted/received in the non-contact manner, and at the same time, a power supply voltage can be supplied in the non-contact manner when a test is run at a wafer level.

It should be noted that a semiconductor device or a method in which the above-mentioned components are appropriately combined or a description of the present invention is changed therebetween is also effective as an aspect of the present invention.

According to the present invention, the power supply can be made sufficiently in the non-contact manner while limiting an increase in chip size when various signals are transmitted/received in the non-contact manner.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENT

Figure 1:
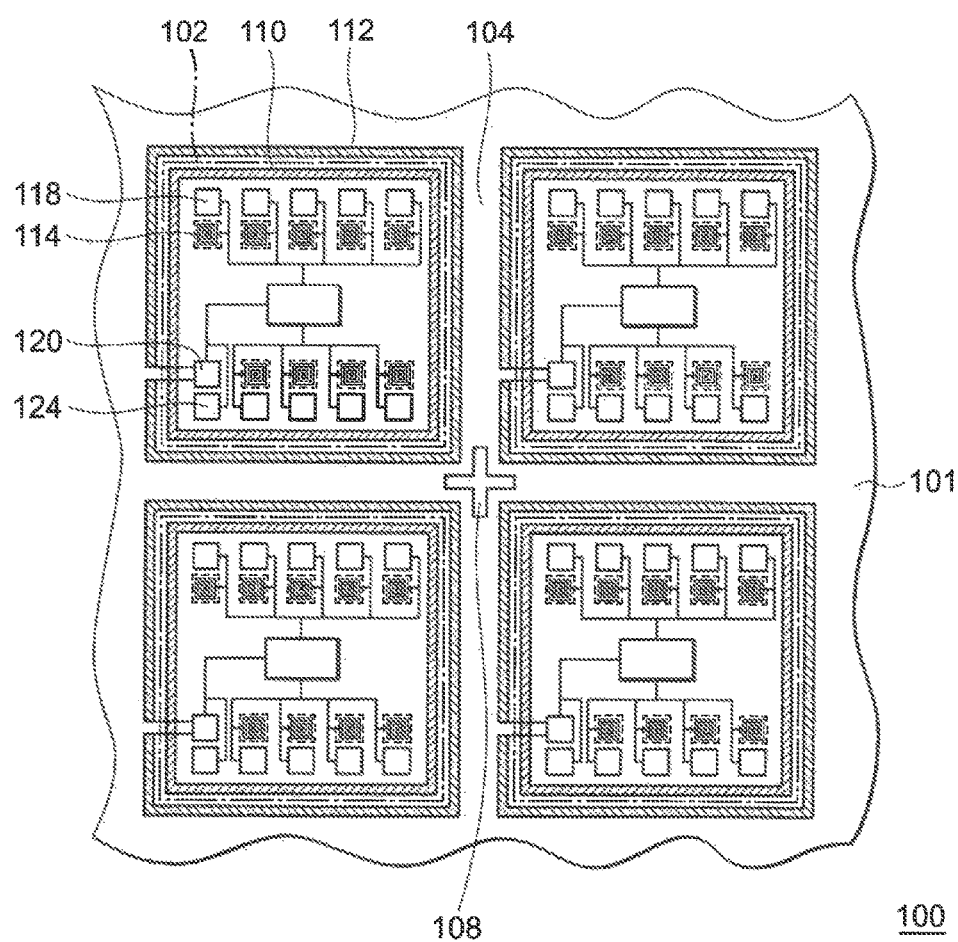
FIG. 1 is a plan view illustrating a structure of a semiconductor device according to an embodiment of the present invention.

Hereinafter, an embodiment of the present invention is described with reference to the drawings. It should be noted that similar components are denoted by similar reference numerals in the respective drawings, and their descriptions are appropriately omitted. In this embodiment, a description is given of a case where, as an example, when a test is run on a chip internal circuit provided within a semiconductor device at a wafer level, various test signals are transmitted/received to/from an external tester in a non-contact manner, and at the same time, the semiconductor device is supplied with a power supply voltage in the non-contact manner.

FIG. 1 is a plan view illustrating a structure of a semiconductor device 100 according to this embodiment.

The semiconductor device 100 includes a semiconductor substrate 101. A plurality of semiconductor chip formation regions 102 and a scribe line region 104 provided around the semiconductor chip formation regions 102 are formed on a surface of the semiconductor substrate 101. FIG. 1 illustrates four semiconductor chip formation regions 102, and an alignment mark 108 is provided thereamong in the scribe line region 104.

Figure 2:
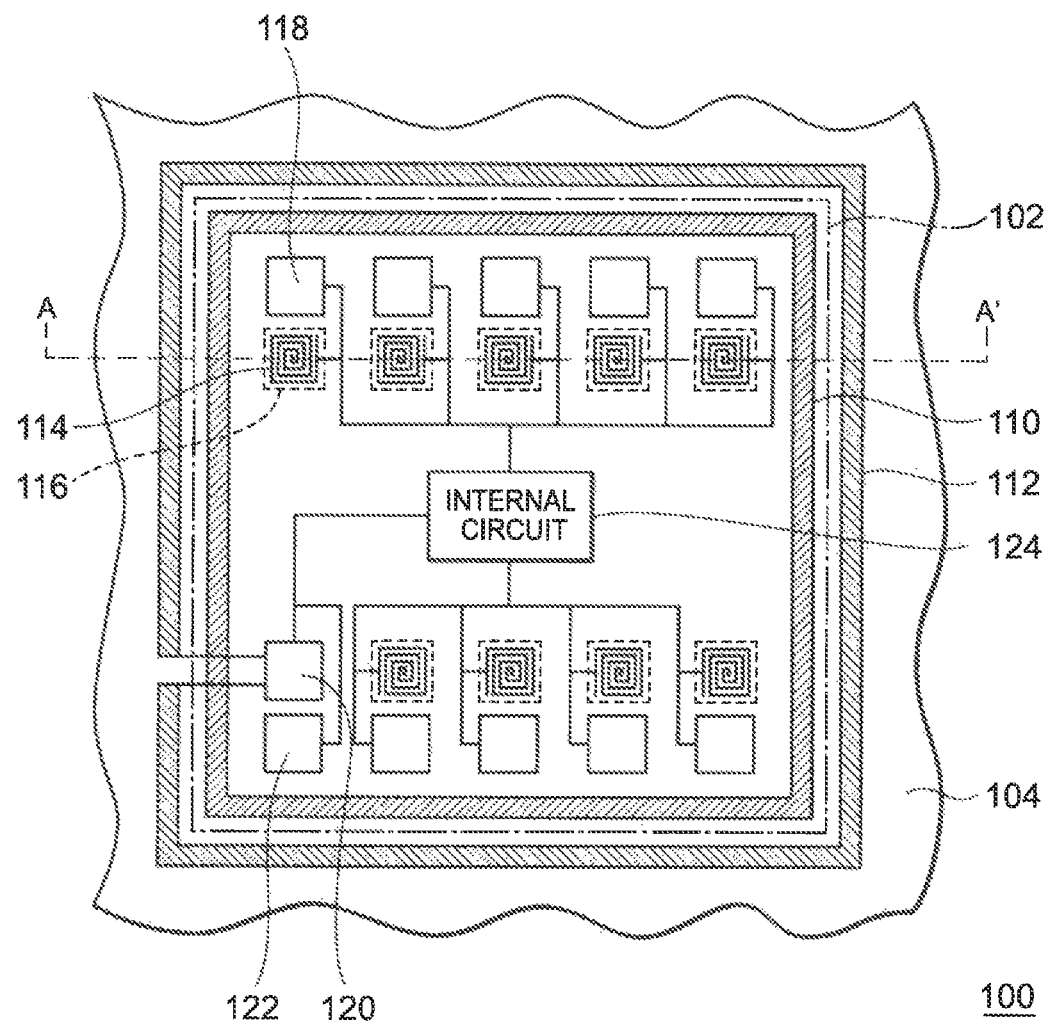
FIG. 2 is a plan view illustrating a structure of a semiconductor chip formation region and a structure of a scribe line region provided around semiconductor chip formation region in detail.

FIG. 2 is a plan view illustrating a structure of one semiconductor chip formation region 102 and a structure of the scribe line region 104 provided around the semiconductor chip formation region 102 in detail.

The semiconductor device 100 includes a chip internal circuit 124, a plurality of signal transmitting/receiving inductors 114 (signal transmitting/receiving units), a plurality of bonding pads 118, a plurality of conversion circuits 116, a power supply circuit 120, and a bonding pad 122, which are each provided within the semiconductor chip formation region 102. The bonding pad 118 and the bonding pad 122 are pads to be later subjected to wire bonding.

In a conventional semiconductor device, the signal transmitting/receiving inductor 114 can be provided in place of a pad which is provided for probing the internal circuit using a probe at a wafer level. Conventionally, when probing is performed using the probe, pad is damaged, and when bonding is performed in the damaged portion, the bonding may cause a poor connection. Therefore, a probing region and a wire-bonding region need to be provided for the pad, and thus the size thereof is increased. In this embodiment, the bonding pad 118 needs to include only the wire-bonding region, whereby the size thereof can be reduced compared with the conventional pad.

It should be noted that the signal transmitting/receiving inductor 114 is provided in the vicinity of a surface of the semiconductor device 100 so as to transmit/receive a signal to/from the external device. In addition, the bonding pad 118 is provided in the vicinity of the surface of the semiconductor device 100 so as to be later subjected to wire bonding. On the other hand, the conversion circuit 116 does not need to be provided in the vicinity of the surface of the semiconductor device 100 because the conversion circuit 116 just converts the signal transmitted/received to/from the external device by the signal transmitting/receiving inductor 114 Therefore, the conversion circuit 116 can be provided so as to overlap the signal transmitting/receiving inductor 114 in a laminating direction of the semiconductor substrate, with the result that an increase in size of the semiconductor device 100 can be limited.

The conversion circuits 116 are each provided under the signal transmitting/receiving inductors 114 correspondingly to the respective signal transmitting/receiving inductors 114. The each signal transmitting/receiving inductor 114 is electrically connected to the chip internal circuit 124 through the corresponding conversion circuit 116. The conversion circuit 116 modulates/demodulates the signal transmitted/received between the chip internal circuit 124 and the outside. Moreover, the each bonding pad 118 is electrically connected to the chip internal circuit 124.

Further, the semiconductor device 100 includes a seal ring 110 provided on a perimeter portion of the each semiconductor chip formation region 102 and a power receiving inductor 112 provided around the seal ring 110. The power receiving inductor 112 has a diameter provided along an outer edge of the each semiconductor chip formation region 102 so as to surround the plurality of signal transmitting/receiving inductors 114 and the plurality of bonding pads 118. The power receiving inductor 112 has one end and another end, which are connected to the power supply circuit 120. The power supply circuit 120 is, for example, a rectifier circuit. The power receiving inductor 112 is connected to the chip internal circuit 124 through the power supply circuit 120. The signal transmitting/receiving inductor 114 and the power receiving inductor 112 can be formed in a coil shape.

The bonding pad 122 is electrically connected to the chip internal circuit 124. The bonding pad 122 is connected to a power supply circuit outside the chip through a bonding wire after the semiconductor device 100 is cut along the scribe line region 104 into chips. Then, power is supplied to the chip internal circuit 124 through the bonding pad 122 from the power supply circuit outside the chip. It should be noted that the bonding pad 122 can also be formed in a smaller size compared with the conventional pad, because it is sufficient that the bonding pad 122 includes only the wire-bonding region.

Figure 3:
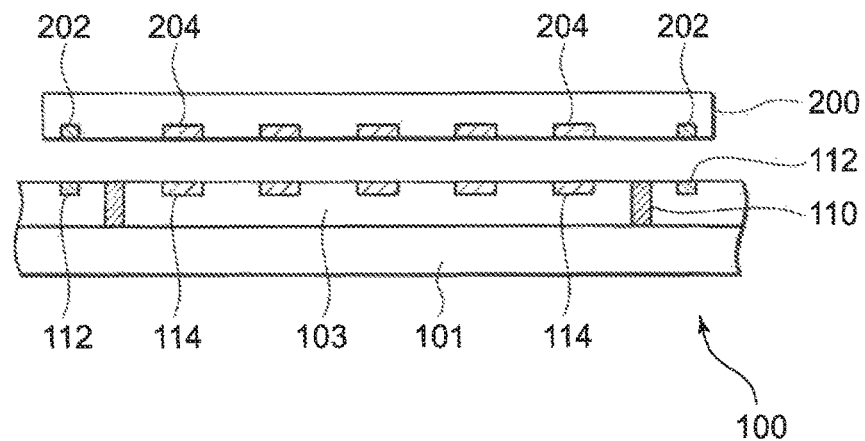
FIG. 3 is a cross-sectional view taken along a line A-A' of FIG. 2.

FIG. 3 is a cross-sectional view taken along a line A-A' of FIG. 2. Here, a structure of a tester 200 which supplies the semiconductor device 100 with a signal is also illustrated.

The semiconductor device 100 includes the signal transmitting/receiving inductors 114, the seal ring 110, and the power receiving inductor 112 within an insulating layer 103 provided on the semiconductor substrate 101. The tester 200 includes a plurality of signal transmitting/receiving inductors 204 provided at positions corresponding to the signal transmitting/receiving inductors 114 provided within the semiconductor chip formation region 102 of the semiconductor device 100 and a power supply inductor 202 provided correspondingly to the power receiving inductor 112 of the semiconductor device 100.

Figure 4:
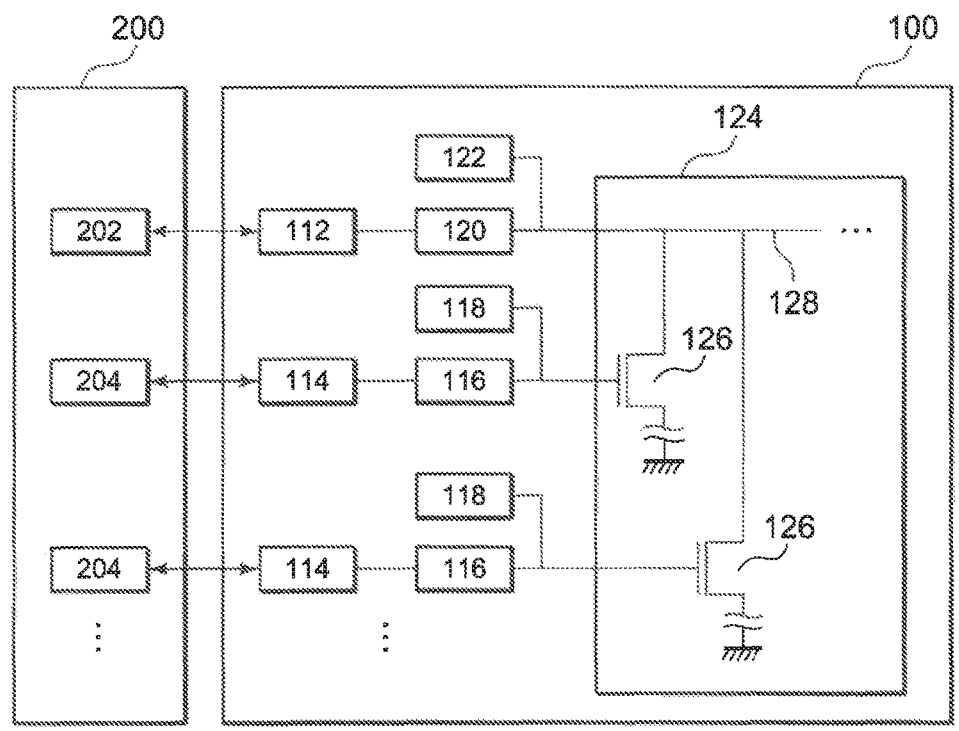
FIG. 4 is a block diagram illustrating the structure of the semiconductor device and a structure of a tester.

FIG. 4 is a block diagram illustrating the structure of the semiconductor device 100 and the structure of the tester 200.

The chip internal circuit 124 can include a plurality of transistors 126 corresponding to the plurality of signal transmitting/receiving inductors 114. One end of a source and a drain of the each transistor 126 is grounded, and another end thereof is connected to the power supply circuit 120 or the bonding pad 122 through a power supply line 128. In this case, a back surface of the semiconductor substrate 101 can be grounded so that one end of the transistor 126 is connected to the back surface of the semiconductor substrate 101 to be grounded. Besides, gates of the transistors 126 are each connected to the signal transmitting/receiving inductors 114 through the conversion circuits 116. Further, the gates of the transistors 126 are each also connected to the bonding pads 118. It should be noted that an input/output buffer circuit may be inserted between the transistor 126 and the bonding pad 118 or between the transistor 126 and the conversion circuit 116, which is not illustrated in FIG. 4.

Next, an operation when the semiconductor device 100 according to this embodiment receives a signal from the tester 200 is described with reference to FIG. 2 to FIG. 4.

First, the tester 200 is brought close to any chip of the semiconductor device 100 so that the signal transmitting/receiving inductor 204 and the power supply inductor 202 of the tester 200 are opposed to the signal transmitting/receiving inductor 114 and the power receiving inductor 112 of the semiconductor device 100, respectively. Then, the signal transmitting/receiving inductor 204 and the power supply inductor 202 of the tester 200 output, to the semiconductor device 100, radio waves each having a predetermined frequency. In this case, a test signal and a power supply signal are output from the signal transmitting/receiving inductor 204 and the power supply inductor 202, respectively.

The power receiving inductor 112 of the semiconductor device 100 converts the signal output from the power supply inductor 202 into an AC electrical signal. The power supply circuit 120 generates a power supply voltage based on the AC electrical signal converted by the power receiving inductor 112 and supplies the generated power supply voltage to the chip internal circuit 124. The signal transmitting/receiving inductor 114 of the semiconductor device 100 converts the signal output from the signal transmitting/receiving inductor 204 into an AC electrical signal. The conversion circuit 116 demodulates the AC electrical signal converted by the signal transmitting/receiving inductor 114 and supplies the demodulated AC electrical signal to the chip internal circuit 124. When a signal is output from the semiconductor device 100 to the tester 200, the conversion circuit 116 modulates the electrical signal supplied from the chip internal circuit 124 and supplies the modulated electrical signal to the signal transmitting/receiving inductor 114. The signal transmitting/receiving inductor 114 outputs the modulated electrical signal as a radio wave to the corresponding signal transmitting/receiving inductor 204 of the tester 200. Accordingly, data is transmitted/received and power is supplied between the semiconductor device 100 and the tester 200.

In this embodiment, the diameter of the power receiving inductor 112 can be increased, whereby a signal large enough to supply the power supply voltage can be obtained. Moreover, the signal transmitting/receiving inductor 114 is formed to be smaller than the power receiving inductor 112 so that the signal transmitting/receiving inductor 114 is included within the power receiving inductor 112, and thus an increase in size thereof can be limited even if a plurality of signal transmitting/receiving units are provided.

Further, in this embodiment, the power receiving inductor 112 is provided around the seal ring 110, and hence the power receiving inductor 112 can be caused to function as a chipping stop layer when wafer dicing is performed along the scribe line region 104. In addition, the power receiving inductor 112 can be used as a chipping sensor for detecting an occurrence of chipping in the semiconductor chip.

The embodiment of the present invention has been described with reference to the drawings, which is an example of the present invention, and various structures other than the above-mentioned structure can also be adopted.

In the embodiment described above, the case where the signal transmitting/receiving unit serves as an inductor has been described as an example. However, the signal transmitting/receiving unit may serve as a capacitor, and data may be transmitted/received to/from an external device such as the tester 200 by capacitive coupling.

Further, in the embodiment described above, the description has been made of the case where various test signals are transmitted/received in a non-contact manner to/from the external tester when a test is run on the chip internal circuit of the semiconductor device at the wafer level. However, the present invention can also be applied to a case where various signals are transmitted/received in the non-contact manner after the semiconductor substrate is cut into chips. Moreover, the power receiving inductor 112 may be provided within the seal ring 110.

It is apparent that the present invention is not limited to the above embodiments, but may be modified and changed without departing from the scope and spirit of the invention.

What is claimed is:

1. A semiconductor device, comprising:
   a semiconductor substrate;
   an internal circuit provided on the semiconductor substrate;
   a plurality of external connection pads provided on the semiconductor substrate and electrically connected to the internal circuit to transmit and receive signals to and from an outside of the semiconductor device;
   an inductor provided on the semiconductor substrate and including the internal circuit and the plurality of external connection pads and connected to the internal circuit;
   a shield member provided on the semiconductor substrate and positioned among the inductor, the internal circuit, and the plurality of external connection pads;
   a power supply circuit provided on the semiconductor substrate; and
   a power supply receiving inductor for supplying power to the internal circuit,
   wherein the power supply receiving inductor is connected to the power supply circuit and supplies power to the internal circuit via the power supply circuit, and
   wherein the plurality of external connection pads include a power supply external connection pad and a plurality of signal external connection pads.

2. The semiconductor device according to claim 1, further comprising:
   a plurality of signal transceivers provided on the semiconductor substrate and being capable of transmitting and receiving signals to and from the outside by electromagnetic induction or capacitive coupling, and being electrically connected to the internal circuit,
   wherein the plurality of signal transceivers are provided corresponding to the plurality of signal external connection pads.

* * * * *